(12) United States Patent
Wilcox et al.

(10) Patent No.: US 6,546,513 B1
(45) Date of Patent: Apr. 8, 2003

(54) DATA PROCESSING DEVICE TEST APPARATUS AND METHOD THEREFOR

(75) Inventors: Richard Jacob Wilcox, Austin, TX (US); Jason D. Mulig, Austin, TX (US); David Eppes, Austin, TX (US); Michael R. Bruce, Austin, TX (US); Victoria J. Bruce, Austin, TX (US); Rosalinda M. Ring, Austin, TX (US); Edward I. Cole, Jr., New Bernalillo, NM (US); Paiboon Tangyunyong, Bernalillo, NM (US); Charles F. Hawkins, Bernalillo, NM (US); Arnold Y. Louie, Santa Clara, CA (US)

(73) Assignee: Advanced Micro Devices, Austin, TX (US)

( * ) Notice: Subject to any disclaimer, the term of this patent is extended or adjusted under 35 U.S.C. 154(b) by 243 days.

(21) Appl. No.: 09/586,572

(22) Filed: Jun. 2, 2000

(51) Int. Cl.[7] .......................... G01R 31/28; G06F 11/00
(52) U.S. Cl. ........................................ 714/738
(58) Field of Search ................. 714/738, 720, 714/724

(56) References Cited

U.S. PATENT DOCUMENTS

| | | | | |
|---|---|---|---|---|
| 5,341,315 A | * | 8/1994 | Niwa et al. | 714/738 |
| 5,504,755 A | * | 4/1996 | Nozuyama | 714/725 |
| 5,648,975 A | * | 7/1997 | Deguchi | 714/738 |
| 5,684,946 A | * | 11/1997 | Ellis et al. | 714/33 |
| 5,968,194 A | * | 10/1999 | Wu et al. | 714/726 |
| 6,122,760 A | * | 9/2000 | Grosch et al. | 714/724 |
| 6,141,630 A | * | 10/2000 | McNamara et al. | 703/14 |
| 6,145,106 A | * | 11/2000 | Chakradhar et al. | 714/742 |
| 6,314,540 B1 | * | 11/2001 | Huott et al. | 714/738 |
| 6,327,686 B1 | * | 12/2001 | Grundmann et al. | 714/738 |

* cited by examiner

*Primary Examiner*—Albert Decady
*Assistant Examiner*—Joseph D. Torres
(74) *Attorney, Agent, or Firm*—Barry S. Newberger; Winstead Sechrest & Minick P.C.

(57) ABSTRACT

A method and apparatus mechanism for testing data processing devices are implemented. The test mechanism isolates critical paths by correlating a scanning microscope image with a selected speed path failure. A trigger signal having a preselected value is generated at the start of each pattern vector. The sweep of the scanning microscope is controlled by a computer, which also receives and processes the image signals returned from the microscope. The value of the trigger signal is correlated with a set of pattern lines being driven on the DUT. The trigger is either asserted or negated depending the detection of a pattern line failure and the particular line that failed. In response to the detection of the particular speed path failure being characterized, and the trigger signal, the control computer overlays a mask on the image of the device under test (DUT). The overlaid image provides a visual correlation of the failure with the structural elements of the DUT at the level of resolution of the microscope itself.

26 Claims, 3 Drawing Sheets

DATA PROCESSING DEVICE TEST APPARATUS AND METHOD THEREFOR

CROSS REFERENCE TO RELATED APPLICATION

The present invention is related to the following U.S. patent application, which is hereby incorporated herein by reference: Ser. No. 09/586,518, entitled "Resistivity Analysis".

GOVERNMENT RIGHTS

This invention was made with government support under contract number DE-AC04-94-AL85000 awarded by the U.S. Department of Energy. The U.S. Government has certain rights in the invention.

TECHNICAL FIELD

The present invention relates in general to data processing systems, and in particular, functional testing of data processing devices.

BACKGROUND INFORMATION

Functional testing of a data processing device, typically a microprocessor or microcontroller, entails driving a set of pattern lines on a selected pin or alternatively a set of pins of the device. (This set of lines may also be referred to as a pattern.) Each pattern line (or, equivalently, vector) contains a sequence of binary values. Each sequence of binary values includes an input portion and an output portion. The input portion constitutes the binary sequence driven on the pins under test, and the output portion contains the sequence of output values expected on a corresponding output pin. The sets of pattern lines are generated to exercise a particular architectural element in the device under test (DUT). The generation of pattern lines to effect a particular test is not germane to the present invention, and will be presumed to be specified in accordance with the practice in the art.

Typically, a region in the device operating parameter space exists for which the architectural element being exercised will perform correctly, and beyond which the element fails. Generally, the parameter space of interest is clock speed and operating voltage. For a given clock speed, a device usually will fail as the operating voltage decreases. In other words, a microprocessor, for example, can be operated at higher clock speeds if the supply voltage is increased. Likewise, for a fixed supply voltage, the device typically fails as the clock speed is increased. Furthermore, increasing the clock speed or the operating voltage increases the power dissipated by the device, and concomitantly, the heating of the device. As the device, or the element being exercised heats up, the transistors in the device slow down. Consequently, as the device heats, failures maybe expected to occur. Thus, as the patterns are repeated over a region in the two-dimensional voltage-speed parameter space, a locus of points is generated (i.e., a speed path failure curve) that delimits the error free operating region of the device element being exercised in the test.

Although the process just described defines the speed path failures for the element being tested, it does not isolate the critical path within the element that is responsible for the error. In other words, the test resolution is limited. For example, if, say, the elements associated with the data cache are being tested, the critical path may be isolated to the load/store unit, or the cache memory itself. However, to enable the designers to expeditiously implement performance improvements, there is a need in the art for test systems and methods that increase the resolution of the critical path identification.

SUMMARY OF THE INVENTION

The foregoing has outlined rather broadly the features and technical advantages of the present invention in order that the detailed description of the invention that follows may be better understood. Additional features and advantages of the invention will be described hereinafter which form the subject of the claims of the invention.

The aforementioned needs are addressed by the present invention. Accordingly, there is provided, in a first form, a method for testing semiconductor devices. The method sequentially drives a first set of pattern vectors on a device under test (DUT). A first predetermined vector of the set of pattern vectors constitutes a pattern vector under test. A trigger signal having a first value is output in association with the sequential driving of the first set of pattern vectors. If a pattern vector other than the first predetermined vector fails, a second set of pattern vectors is sequentially driven on the DUT, in which a second predetermined vector of the second set of pattern vectors comprises the pattern vector under test. A trigger signal having a second value is output in association with the sequential driving of the second set of pattern vectors.

There is additionally provided, in a second and third form, respectively, a computer program product and a data processing system for testing semiconductor devices. The program product includes instructions for performing the aforesaid method, and the data processing system contains circuitry operable for performing the method.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
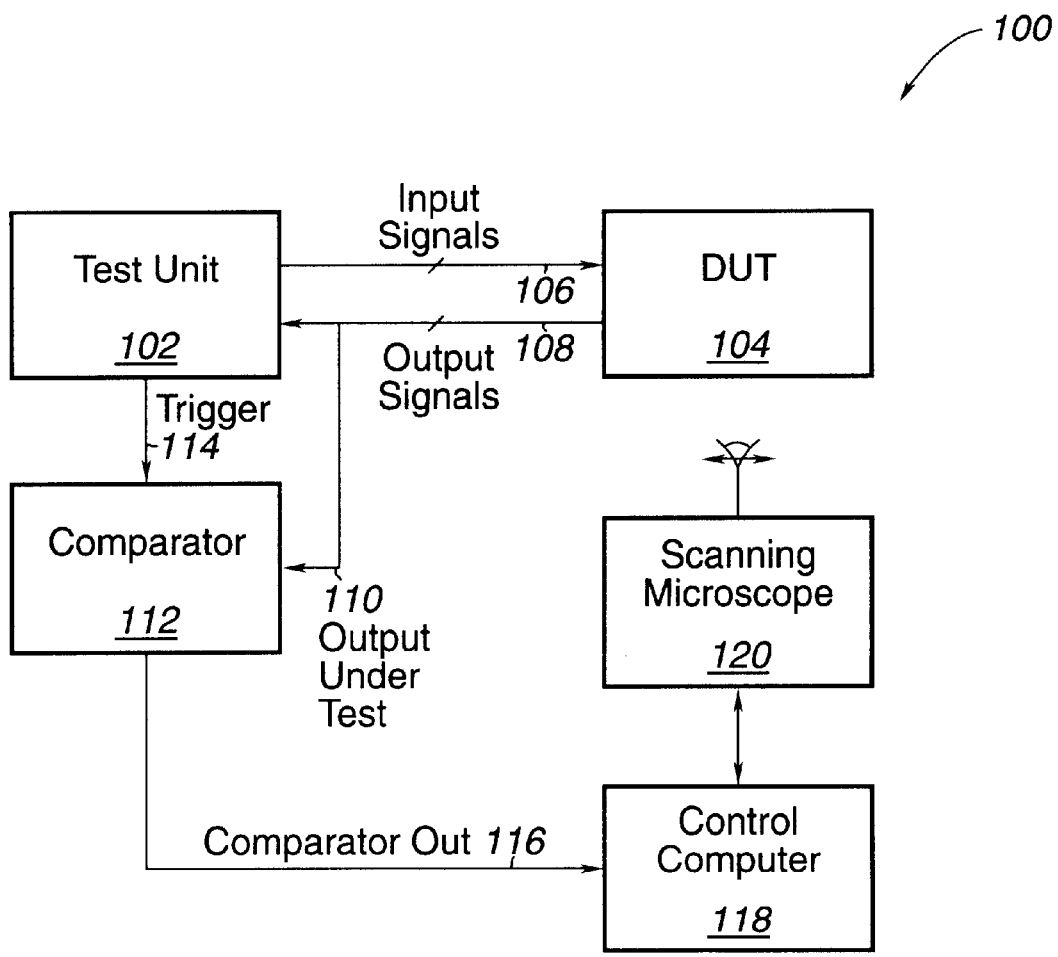
FIG. 1 illustrates, in block diagram form, a test system in accordance with an embodiment of the present invention.

The present invention provides a mechanism for testing data processing devices. The test mechanism isolates critical paths by correlating a scanning microscope image with a selected speed path failure. A trigger signal having a preselected value is generated at the start of each pattern vector. The sweep of the scanning microscope is controlled by a computer, which also receives and processes the image signals returned from the microscope. In response to the detection of the particular speed path failure being characterized, and the trigger signal, the control computer overlays a mask on the image of the device under test (DUT). The overlaid image provides a visual correlation of the failure with the structural elements of the DUT at the level of resolution of the microscope itself.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views. Furthermore, during a description of the implementation of the invention, the terms "assert" and "negate" and various grammatical forms thereof, are used to avoid confusion when dealing with the mixture of "active high" and "active low" logic signals. "Assert" is used to refer to the rendering of a logic signal or register bit into its active, or logically true, state. "Negate" is used to refer to the rendering of a logic signal of register bit into its inactive, or logically false, state.

Although the present invention and its advantages have been described in detail, it should be understood that various changes, substitutions and alterations can be made herein without departing from the spirit and scope of the invention as defined by the appended claims.

Refer now to FIG. 1 illustrating in block diagram form, a test apparatus in accordance with an embodiment of the present invention. Additional details may be found in the co-pending, U.S. Patent Application entitled "Resistivity Analysis," incorporated herein by reference. Test unit 102 drives a sequence of binary values onto a selected set of inputs in DUT 104. The signals driven on the pins of DUT 104 are collectively illustrated in FIG. 1 as input signals 106. In response to the input pattern driven via input signals 106, DUT 104 generates a set of output signals 108, that are returned to test unit 102. Test unit 102 may be a commercially available apparatus. Suitable commercial devices include the Teradyne Model J973 VLSI Test System manufactured by Teradyne, Inc., Boston, Mass. or, alternatively, the IMS Digital Test Station manufactured by Integrated Management Systems, Inc. (IMS), Beaverton, Oreg.

As previously discussed, a particular speed path failure may be selected for isolation of the critical path responsible for the failure. The output exhibiting the selected speed path failure, output under test 110 is input to comparator 112. Additionally, test unit 102 asserts trigger 114 when the pattern line generating the fault (which may be referred to as the "test line") under test is driven by test unit 102 onto DUT 104. This may be further understood by referring to Table I. A test operation may include a number, n+1, of pattern vectors. The test line may be taken to be the line n. Typically, once a line fails, all lines thereafter fail, and thus the original pattern, which generated the failure under test, may be treated beyond the test line. Each pattern includes an input portion $I_I$ which includes an input pattern constituting a sequence of p binary values, $i_1{}^j, i_2{}^j \ldots i_p{}^j$ $1 \leq j \leq n+1$. Each clock cycle of DUT 104, the values, $i_p{}^j, i_2{}^j \ldots i_p{}^j$ for $1 \leq j \leq n+1$, are sequentially driven onto the corresponding pin of DUT 104. This process is sequentially repeated for each of pattern lines, 1, . . . , n+1. Test unit 102 may sequentially drive lines, 1, . . . , n+1, in response to an instruction script. After driving pattern line n, the test loops back to pattern line 1.

Each pattern vector also includes an output pattern, $O_j$ $1 \leq j \leq n+1$, including an output binary sequence, $O_1{}^j, O_2{}^j,$ $O_p{}^j, 1 \leq j \leq n+1$. The output sequence represents the sequence of binary values expected on the corresponding output pin in the absence of a failure.

At the beginning of each pattern line, trigger 114 is either negated or asserted by test unit 102 in accordance with the pattern line generating the fault under test. Thus, in Table I, in which the nth line generates the failure under test, trigger 114 is asserted when test unit 102 begins driving the nth line onto the DUT 104.

TABLE I

| Line | Trigger | Input | Output | Script Instruction |
|------|---------|-------|--------|--------------------|
| 1 | 0 | $I_1$ | $O_1$ | Next Line |
| 2 | 0 | $I_2$ | $O_2$ | Next Line |
| 3 | 0 | $I_3$ | $O_3$ | Next Line |
| . | . | . | . | . |
| . | . | . | . | . |
| . | . | . | . | . |
| n | 1 | $I_n$ | $O_n$ | Next Line |
| n+1 | 0 | $I_{n+1}$ | $O_{n+1}$ | Loop to Line 1 |

In the embodiment illustrated, it is assumed that logic "TRUE" is represented by the value "1", and conversely, however, an artisan of ordinary skill would recognize that complementary logic levels could also be used in the present invention without affecting the principles thereof Trigger 114 is input to comparator 112, along with the output signal under test 110. Comparator 112 compares the value of the output under test 10 with the value expected when the device fails, and if the output under test 110 indicates a fault and trigger 114 is asserted, comparator asserts comparator output 116. Comparator output 116 is provided to control computer 118 which controls scanning microscope 120. Scanning microscope 120 may be a commercial unit, for example, a model LSM 510 laser scanning microscope manufactured by CarlZeiss, Inc., Thornwood, N.Y. In such an embodiment, control computer 118 may be a conventional personal computer (PC), equipped with an ultra wide Small Computer System Interface (SCSI) port, and that is compatible with the Windows NT® 4.0 operating system with a central processing unit (CPU) equivalent to a 400 MHz, Pentium II® processor. (Windows NT® is a registered trademark of Microsoft Corporation, and Pentium II® is a registered trademark of Intel Corporation.) Control computer 118 controls the scan of scanning microscope 120 across the surface of DUT 104, and receives a digitized image of DUT 104 from the scanning microscope 120. Control computer 118 overlays a mask on the digital image received from scanning microscope 120. The pixels constituting the mask may, in an embodiment of the present invention, may be set to "black" or "0" when comparator output 116 is negated, and conversely, when comparator 116 is asserted, be set to "white" or "1". The overlay of the mask with the digital image received from scanning microscope 120 maybe performed in such an embodiment by forming the exclusive-OR (XOR) of each pixel in the mask with the corresponding pixel in the image from scanning microscope 120. In this way, the region of DUT 104 that correlates with the failure under test is masked with a "white" illumination while the remaining portions of the image of DUT 104 are unaffected by the mask.

In an embodiment of the present invention, the failure free output may have an output pattern $O_j=0, 1 \leq j \leq n$, in which the output line under test is negated, or logic "0" in a positive logic implementation. In this embodiment, comparator 112 may be implemented using a D flip-flop (FF). Trigger 114 is then provided to the clock input of the D FF, and output under test 116 is coupled to the D input.

With the increasing clock speeds of modem data processing devices, the speed of the hardware comparator 112 becomes a factor in the operation of test system 100. Additionally, the physical end of the line carrying output under test 110, and the loading represented thereby make constrain the speed at which system 100 may be operable. Additionally, the signal lines are susceptible to the introduction of noise.

Figure 2:
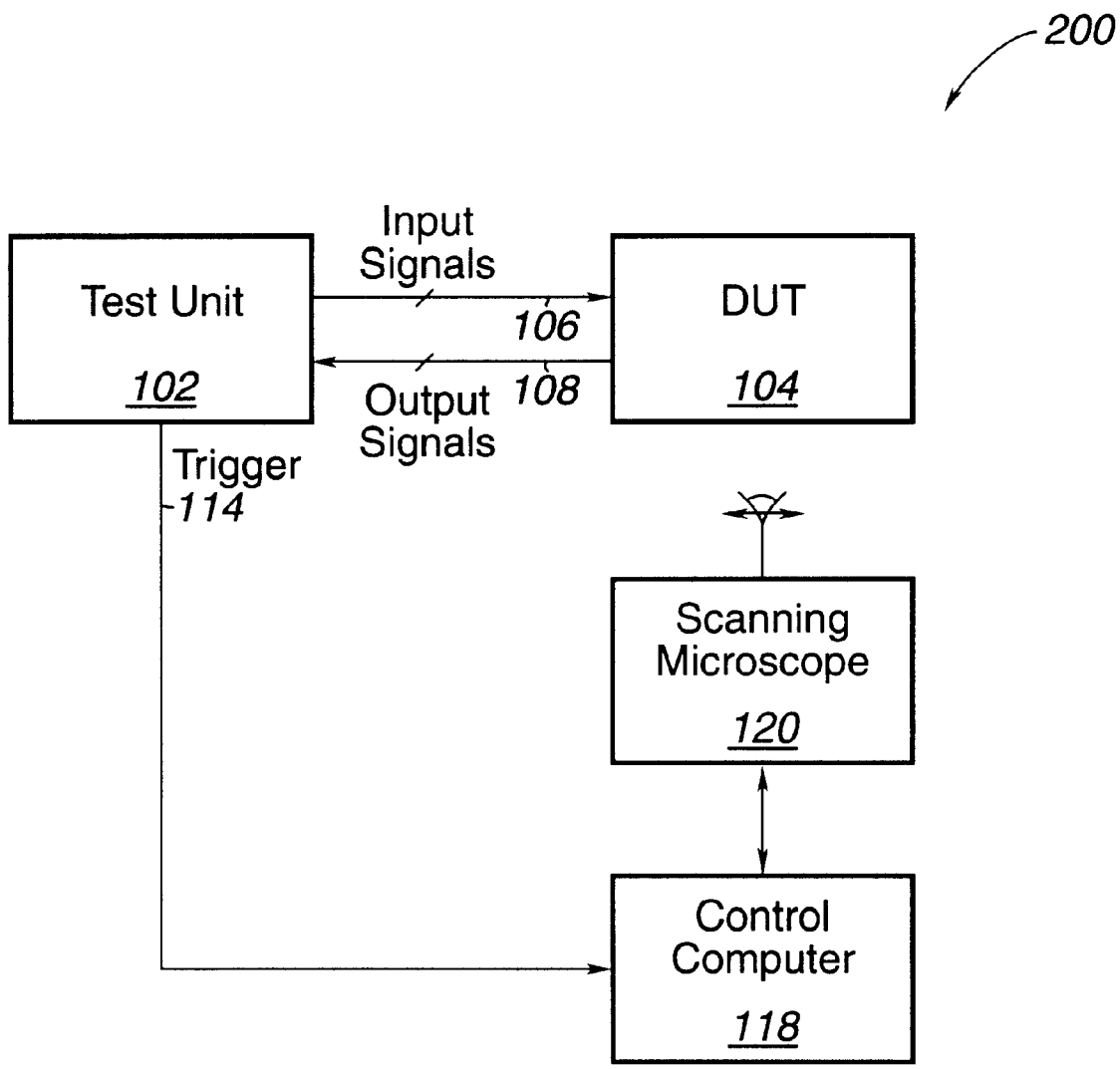
FIG. 2 illustrates, in block diagram form, a test system in accordance with an alternative embodiment of the present invention.

FIG. 2 illustrates an alternative embodiment of a data processing device system 200 in which a comparator is eliminated by providing the trigger signal directly to the control computer. Additionally, the output under test line 110 in FIG. 1 is eliminated in test apparatus 200, FIG. 2. Otherwise, the interconnection of the hardware in the embodiment in FIG. 2 is unchanged from that in FIG. 1. However, the pattern under test is modified as shown in Table II.

TABLE II

| Test Line | Pattern Line | Trigger | Input | Output | Test Unit Script |
|---|---|---|---|---|---|
| 1 | 1 | 1 | $I_1$ | $O_1$ | Next Line |
| 2 | 2 | 1 | $I_2$ | $O_2$ | If Fail Go to Line n+1 |
| 3 | 3 | 1 | $I_3$ | $O_3$ | If Fail Go to Line n+1 |
| . | . | . | . | . | If Fail Go to Line n+1 |
| . | . | . | . | . |  |
| . | . | . | . | . |  |
| n−1 | n−1 | 1 | $I_{n-1}$ | $O_{n-1}$ | If Fail Go to Line n+1 |
| n | n | 1 | $I_n$ | $O_n$ | If Fail Go to Line 1 |
| n+1 | 1 | 0 | $I_1$ | $O_1$ | Next Line |
| n+2 | 2 | 0 | $I_2$ | $O_2$ | If Fail Go to Line n+1 |
| . | . | . | . | . | . |
| . | . | . | . | . | . |
| . | . | . | . | . | . |
| 2n−1 | n−1 | 0 | $I_{n-1}$ | $O_{n-1}$ | If Fail Go to Line n+1 |
| 2n | n | 0 | $I_n$ | $O_n$ | If Pass Go to Line n+1 |
| 2n+1 | Dummy | 1 | Don't Care | Don't Care | Go to Line 1 |
| 2n | n | 0 | $I_k$ | $O_k$ | If Pass Go to Line n+1 |
| 2n+1 | Dummy | 1 | Don't Care | Don't Care | Go to Line 1 |

Begin with the test line corresponding to the nth line in the pattern, the test pattern is modified such that the first n lines correspond to then lines of the pattern as in Table I. The test pattern then includes an additional n lines which replicate the first n lines of the pattern.

Additionally, a trigger signal is associated with each of the lines of the test pattern, as in the test apparatus embodiment of FIG. 1. However, the trigger signal associated with the first n lines is asserted (in a positive logic implementation has the logic value "1"). The trigger associated with the second set of n lines is negated (logic "0" in a positive logic implementation). Additionally, the test unit script is modified as depicted in Table 2. The last line of the test pattern is a dummy line that is untested and the input and output patterns may be arbitrary. The test unit asserts the trigger on launching the dummy line and then branches back to line 1.

While looping through the pattern, either the first set, test lines 1, . . . , n, or lines n+1, . . . , 2n, operating parameters of the DUT may be modified. For example, the operating temperature may be increased. Alternatively, conditions may be modified locally, by, for example heating a local region of the DUT with the microscope light source. This is discussed in detail in the co-pending U.S. Patent Application entitled "Resistivity Analysis," incorporated herein by reference. As a consequence, one or more pattern lines that had not previously failed may fail on subsequent passes through the pattern sets.

Figure 3:
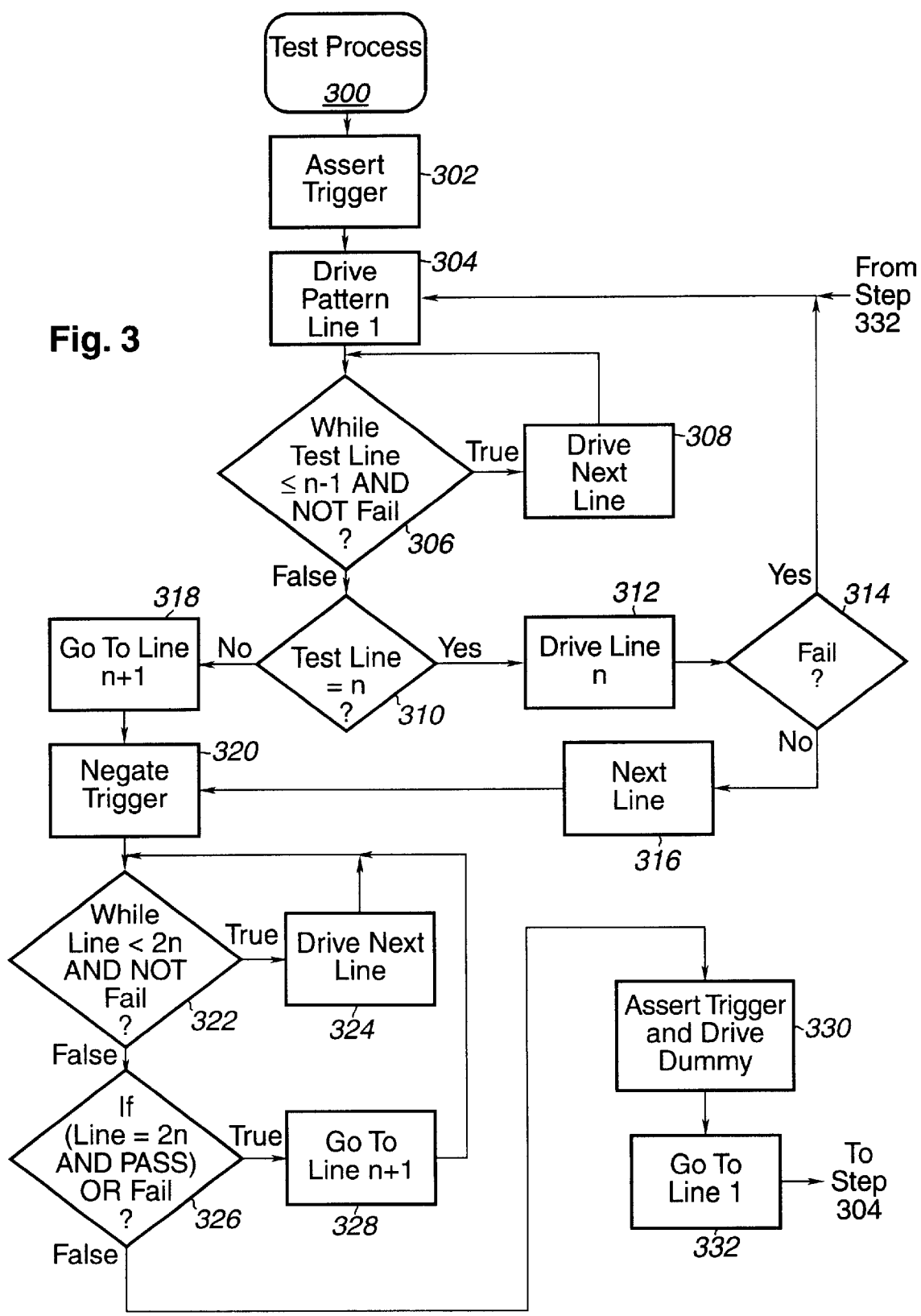
FIG. 3 illustrates, in flow chart form, a test methodology in accordance with an embodiment of the present invention.

The test unit script may be further understood by referring now to FIG. 3, illustrating a test methodology in accordance therewith. This process 300 asserts the trigger signal, for example, Trigger 114 in FIG. 2, instep 302, and drives pattern vector 1 in step 304.

In step 306, process 300 enters a loop over the first n−1 test lines. While each of the first n−1 lines is driven without failing, the next succeeding line is driven, step 308. In other words, each succeeding line is driven as long as the current line does not fail, or nth line is not reached.

Process 300 breaks out of the loop (steps 306 and 308) if either the nth line is reached and none of the previous lines have failed, or if one of the lines 1, . . . n−1 failed. In step 310 the line number is tested. If the current line is the nth line, line n is driven step 310. If, in step 314 the corresponding pattern fails, then the correct failure, that is the failure under test, has been found and process 300 returns to line 1, step 304. The trigger asserted in step 302 is maintained. If, however, in step 314 line n has not failed, then the test drops to the next line, step 316.

Returning to step 310, if on breaking out of the loop (steps 306, 308) the current line is not the nth line, then one of the lines 1, . . . n−1 has failed. Then, in step 318, the test branches to line n+1, and the trigger is negated in step 320. [Note that if the nth line, driven in step 312, had passed, process 300 would also fall through to the n+1st line via step 316, and the trigger is negated.]

Process 300 then loops through test lines n+1, . . . 2n −1, in steps 322 and 324.

Process 300 breaks out of the loop if the 2nth line in the test pattern has been reached, or if a failure has occurred on one of the lines n+2 . . . , 2n−1.

In step 326 it is determined if the line just driven is line 2n and line 2n passed, or if step 326 was reached by one of the proceeding lines n+2, . . . , 2n−1 failing. If so, as "incorrect" failure has been found and process 300 branches to line n+1 in step 328 and returns to step 322, maintaining the value of the trigger negated in step 320. If however, all of lines n+2, . . . , 2n−1 pass and line 2n fails, then have found the "correct" fail, and step 326 follows the "No" branch and falls through to dummy line 2n+1, step 330. The trigger is asserted and the dummy line driven without observing the output states of the DUT. Process 300 then branches to line 1 in step 332.

In this way, the present invention, in accordance with an embodiment in FIG. 2 eliminates a hardware comparator by allowing for a stage where the trigger is set, that is, finds the failure in question, in a stage where the trigger is not set. [Note that asserting the trigger when the dummy line is driven (step 330 above) results in the trigger being set when the fault in the test line is detected, avoiding a possible loss in clock cycles occupied by the test unit in executing the branch back to line 1, and relying on the sending of the trigger signal on line 1 (equivalent to branching to step 302 in FIG. 3).

Although the present invention and its advantages have been described in detail, it should be understood that various changes, substitutions and alterations can be made herein without departing from the spirit and scope of the invention as defined by the appended claims.

What is claimed is:

1. A device test method comprising the steps of:
   sequentially driving a first set of pattern vectors on a device under test (DUT), wherein a first predetermined vector of said first set of pattern vectors comprises a pattern vector under test, and outputting a trigger signal having a first value in association with said sequentially driving said first set of pattern vectors;
   if a pattern vector other than said first predetermined vector fails, sequentially driving a second set of pattern vectors on said DUT, wherein a second predetermined vector of said second set of pattern vectors comprises said pattern vector under test, and outputting said trigger signal having a second value in association said sequentially driving said second set of pattern vectors.

2. The method of claim 1 further comprising the step of:
   if said first predetermined vector fails, repeating said step of sequentially driving said first set of pattern vectors on said DUT.

3. The method of claim 1 further comprising the steps of, if no pattern vector fails:
   repeating said step of sequentially driving said second set of pattern vectors on said DUT and outputting said trigger signal having said second value in association with said sequentially driving said first set of pattern vectors; and
   varying a device parameter of said DUT until at least one of said second set of pattern vector fails.

4. The method of claim 3 wherein said step of varying said device parameter comprises the step of raising a temperature of said DUT.

5. The method of claim 1 further comprising the step of:
   if said second predetermined pattern vector fails, repeating said step of sequentially driving said first set of pattern vectors on said DUT and outputting said trigger signal having said first value in association with said sequentially driving said first set of pattern vectors.

6. The method of claim 4 further comprising the steps of:
   if said second predetermined pattern vector does not fail, repeating sequentially driving said second set of pattern vectors on said DUT, and outputting said trigger signal having a second value in association said sequentially driving said second set of pattern vectors; and
   varying a device parameter of said DUT until at least one of said second set of pattern vector fails.

7. The method of claim 5 wherein said step of varying said device parameter comprises the step of raising a temperature of said DUT.

8. The method of claim 6 wherein said step of varying said device parameter comprises the steps of heating at least a portion of state-changing circuitry in the DUT to cause a failure due to suspect circuitry, the state-changing circuitry including a suspect signal path site and wherein the method further includes the steps of:
   detecting, in response to the selected portion being heated, a state-changing transition between a failed mode and a recovered mode in the suspect signal path site; and
   using the detected state-changing transition, determining that the signal path site has a resistivity that changes between the failed mode and the recovered mode.

9. The method of claim 8 wherein said step of detecting includes determining that said trigger signal has said second value.

10. The method of claim 1 wherein said trigger signal is operable for correlating a failure of said pattern under test and a structural portion of said DUT.

11. A computer program product embodied in a tangible storage medium, said program product including a program of instructions for performing the steps of:
    sequentially driving a first set of pattern vectors on a device under test (DUT), wherein a first predetermined vector of said first set of pattern vectors comprises a pattern vector under test, and outputting a trigger signal having a first value in association with said sequentially driving said first set of pattern vectors;
    if a pattern vector other than said first predetermined vector fails, sequentially driving a second set of pattern vectors on said DUT, wherein a second predetermined vector of said second set of pattern vectors comprises said pattern vector under test, and outputting said trigger signal having a second value in association said sequentially driving said second set of pattern vectors.

12. The program product of claim 11 further including instructions for performing the step of, if said first predetermined vector fails, repeating said step of sequentially driving said first set of pattern vectors on said DUT.

13. The program product of claim 11 further including instructions for performing the steps of, if no pattern vector fails:
    repeating said step of sequentially driving said second set of pattern vectors on said DUT and outputting said trigger signal having said second value in association with said sequentially driving said second set of pattern vectors; and
    varying a device parameter of said DUT until at least one of said second set of pattern vector fails.

14. The program product of claim 13 wherein said step of varying said device parameter comprises the step of raising a temperature of said DUT.

15. The program product of claim 11 further including programming for performing the steps of:
    if said second predetermined pattern vector fails, repeating said step of sequentially driving said first set of pattern vectors on said DUT and outputting said trigger signal having said first value in association with said sequentially driving said first set of pattern vectors.

16. The program product of claim 15 further including instructions for performing the steps of, if said second predetermined pattern vector does not fail, repeating sequentially driving said second set of pattern vectors on said DUT, and outputting said trigger signal having a second value in association said sequentially driving said second set of pattern vectors; and
    varying a device parameter of said DUT until at least one of said second set of pattern vector fails.

17. The program product of claim 16 wherein said step of varying said device parameter comprises the step of raising a temperature of said DUT.

18. The program product of claim 11 wherein said trigger signal is operable for correlating a failure of said pattern under test and a structural portion of said DUT.

19. A data processing system comprising:
    circuitry operable for sequentially driving a first set of pattern vectors on a device under test (DUT), wherein a first predetermined vector of said first set of pattern vectors comprises a pattern vector under test, and outputting a trigger signal having a first value in association with said sequentially driving said first set of pattern vectors;
    circuitry operable for, if a pattern vector other than said first predetermined vector fails, sequentially driving a second set of pattern vectors on said DUT, wherein a second predetermined vector of said second set of pattern vectors comprises said pattern vector under test, and outputting said trigger signal having a second value in association said sequentially driving said second set of pattern vectors.

20. The data processing system of claim 19 further including circuitry operable for, if said first predetermined vector fails, repeating said step of sequentially driving said first set of pattern vectors on said DUT.

21. The data processing system of claim 19 further including circuitry operable for, if no pattern vector fails:
   repeating said step of sequentially driving said second set of pattern vectors on said DUT and outputting said trigger signal having said second value in association with said sequentially driving said second set of pattern vectors; and
   varying a device parameter of said DUT until at least one of said second set of pattern vector fails.

22. The data processing system of claim 21 wherein said step of varying said device parameter comprises the step of raising a temperature of said DUT.

23. The data processing system of claim 19 further including:
   circuitry operable for, if said second predetermined pattern vector fails, repeating said step of sequentially driving said first set of pattern vectors on said DUT and outputting said trigger signal having said first value in association with said sequentially driving said first set of pattern vectors.

24. The data processing system of claim 23 further including:
   circuitry operable for, if said second predetermined pattern vector does not fail, repeating sequentially driving said second set of pattern vectors on said DUT, and outputting said trigger signal having a second value in association said sequentially driving said second set of pattern vectors; and
   circuitry operable for varying a device parameter of said DUT until at least one of said second set of pattern vector fails.

25. The data processing system of claim 24 wherein said step of varying said device parameter comprises the step of raising a temperature of said DUT.

26. The data processing system of claim 19 wherein said trigger signal is operable for correlating a failure of said pattern under test and a structural portion of said DUT.

* * * * *

UNITED STATES PATENT AND TRADEMARK OFFICE
CERTIFICATE OF CORRECTION

PATENT NO.     : 6,546,513 B1
DATED          : April 8, 2003
INVENTOR(S)    : Richard Jacob Wilcox et al.

It is certified that error appears in the above-identified patent and that said Letters Patent is hereby corrected as shown below:

Column 5,
Line 42, please delete the table following "Table II".

Signed and Sealed this

Thirtieth Day of September, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,546,513 B1
DATED        : April 8, 2003
INVENTOR(S)  : Richard J. Wilcox et al.

It is certified that error appears in the above-identified patent and that said Letters Patent is hereby corrected as shown below:

Title page,
Item [73], Assignee, please add the following:
-- Sandia National Laboratories, Albuquerque, NM --.

Signed and Sealed this

First Day of November, 2005

JON W. DUDAS
*Director of the United States Patent and Trademark Office*